United States Patent
Mofidi et al.

(10) Patent No.: US 11,018,703 B2
(45) Date of Patent: May 25, 2021

(54) SYSTEMS AND METHODS FOR ANTENNA TUNING

(71) Applicant: QUALCOMM Incorporated, San Diego, CA (US)

(72) Inventors: Mahbod Mofidi, San Diego, CA (US); Arild Kolsrud, El Cajon, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 16/373,495

(22) Filed: Apr. 2, 2019

(65) Prior Publication Data

US 2020/0099407 A1 Mar. 26, 2020

Related U.S. Application Data

(60) Provisional application No. 62/734,828, filed on Sep. 21, 2018.

(51) Int. Cl.
| | |
|---|---|
| *H04B 1/40* | (2015.01) |
| *H04B 1/04* | (2006.01) |
| *H04B 17/309* | (2015.01) |
| *H03H 7/01* | (2006.01) |
| *H03H 7/40* | (2006.01) |
| *H04B 1/00* | (2006.01) |
| *H04B 1/18* | (2006.01) |
| *H03H 7/38* | (2006.01) |

(52) U.S. Cl.
CPC ......... *H04B 1/0458* (2013.01); *H03H 7/1733* (2013.01); *H03H 7/40* (2013.01); *H04B 1/006* (2013.01); *H04B 1/0078* (2013.01); *H04B 1/18* (2013.01); *H04B 17/309* (2015.01); *H03H 2007/386* (2013.01)

(58) Field of Classification Search
USPC ................................................. 455/77, 67.13
See application file for complete search history.

(56) References Cited

U.S. PATENT DOCUMENTS

| | | | | |
|---|---|---|---|---|
| 5,335,363 | A * | 8/1994 | Basciano | H04B 1/123 333/126 |
| 9,326,320 | B2 * | 4/2016 | Hong | H04B 1/006 |
| 9,419,470 | B2 | 8/2016 | Von Novak, III et al. | |
| 2009/0115549 | A1 * | 5/2009 | Lee | H04B 1/18 333/101 |

(Continued)

FOREIGN PATENT DOCUMENTS

WO 2015041790 A1 3/2015

OTHER PUBLICATIONS

International Search Report and Written Opinion—PCT/US2019/045523—ISA/EPO—dated Oct. 29, 2019.

*Primary Examiner* — Kathy W Wang-Hurst
*Assistant Examiner* — Max Mathew
(74) *Attorney, Agent, or Firm* — Austin Rapp

(57) ABSTRACT

A wireless communication device is described. The wireless communication device includes a processor, a memory in communication with the processor and instructions stored in the memory. The instructions are executable by the processor to detect a signal degradation indication for a radio frequency (RF) signal. The instructions are also executable by the processor to cause a switch to select a combination of a first matching network and a second matching network coupled to an antenna in response to detecting the signal degradation indication.

30 Claims, 10 Drawing Sheets

(56) References Cited

U.S. PATENT DOCUMENTS

| | | | |
|---|---|---|---|
| 2010/0225543 A1* | 9/2010 | Kakitsu | H04B 7/082 |
| | | | 343/702 |
| 2012/0112970 A1* | 5/2012 | Caballero | H01Q 7/00 |
| | | | 343/702 |
| 2012/0238224 A1* | 9/2012 | Iwai | H04B 1/0458 |
| | | | 455/91 |
| 2012/0269083 A1 | 10/2012 | Kamerman | |
| 2013/0208608 A1* | 8/2013 | Piazza | H01Q 5/342 |
| | | | 370/252 |
| 2013/0214979 A1* | 8/2013 | McMilin | H01Q 5/328 |
| | | | 343/750 |
| 2014/0266922 A1* | 9/2014 | Jin | H01Q 5/314 |
| | | | 343/702 |
| 2015/0002348 A1* | 1/2015 | Wong | H01Q 1/48 |
| | | | 343/724 |
| 2015/0303883 A1 | 10/2015 | Huang et al. | |
| 2016/0323053 A1* | 11/2016 | Kang | H01Q 5/314 |
| 2017/0358838 A1* | 12/2017 | Huang | H01Q 9/14 |
| 2018/0026592 A1* | 1/2018 | Wallis | H04B 1/1607 |
| | | | 330/302 |
| 2018/0226367 A1* | 8/2018 | Babcock | H01L 23/66 |
| 2018/0294570 A1* | 10/2018 | Stowell | H01Q 11/04 |
| 2019/0149142 A1* | 5/2019 | Scott | H03K 17/04123 |
| | | | 327/109 |
| 2019/0222238 A1* | 7/2019 | Bai | H04B 1/0067 |
| 2019/0273528 A1* | 9/2019 | Watanabe | H04B 1/0057 |
| 2019/0296777 A1* | 9/2019 | Desclos | H03F 3/211 |
| 2020/0036400 A1* | 1/2020 | Kim | H04B 1/006 |
| 2020/0343866 A1* | 10/2020 | Deguchi | H03F 1/565 |

\* cited by examiner

SYSTEMS AND METHODS FOR ANTENNA TUNING

RELATED APPLICATIONS

This application is related to and claims priority from U.S. Provisional Patent Application Ser. No. 62/734,828, filed Sep. 21, 2018, for "SYSTEMS AND METHODS FOR ANTENNA TUNING."

TECHNICAL FIELD

The described technology generally relates to an apparatus and method of wireless communication. More particularly, the technology relates to radio frequency (RF) link improvement by active antenna tuning.

BACKGROUND

Electronic devices (e.g., cellular telephones, wireless modems, computers, digital music players, Global Positioning System units, Personal Digital Assistants, gaming devices, etc.) have become a part of everyday life. Small computing devices are now placed in everything from vehicles to housing locks. The complexity of electronic devices has increased dramatically in the last few years. For example, many electronic devices have one or more processors that help control the device, as well as a number of digital circuits to support the processor and other parts of the device.

The wireless communication environment in a home or an office generally includes a number of independently developed radio access technologies and standards. These technologies were initially designed for target applications and they perform relatively well for these applications. In a typical home or office environment, an access to content (e.g., web, video, etc.) is provided to a broadband modem through the home-owner's IP backhaul connection. For instance, mobile services are provided through the cellular network, through either a macro cell or a femto cell located within the home or office. Wireless local area network (WLAN) access points (APs) provide data connectivity between computers, cell phones, laptops, printers, and other wireless stations using 802.11-based Wi-Fi technology.

Another communication medium currently being implemented in electronic equipment is Bluetooth technology. For example, a wireless communication device may include a transmitter and/or a receiver for communicating with other devices using Bluetooth protocols.

SUMMARY

A wireless communication device is described. The wireless communication device includes a processor, a memory in communication with the processor and instructions stored in the memory. The instructions are executable by the processor to detect a signal degradation indication for a radio frequency (RF) signal. The instructions are also executable by the processor to cause a switch to select a combination of a first matching network and a second matching network coupled to an antenna in response to detecting the signal degradation indication.

The second matching network may be coupled to the first matching network and to the antenna serially when the second matching network is selected by the switch. The second matching network may be a shunt when the first matching network is selected by the switch.

The first matching network may be coupled to a first terminal of the switch. The second wireless communication device may be coupled to a second terminal of the switch. The antenna may be coupled to a third terminal of the switch.

An input of the first matching network may be coupled to a transceiver. An output of the first matching network may be coupled to the second matching network.

The first matching network may be tuned for a free space condition where the antenna is not affected by external dielectric disturbances. The second matching network may be tuned in combination with the first matching network for a degraded signal condition where the antenna is affected by external dielectric disturbances.

Detecting a signal degradation indication for the RF signal may include monitoring a packet retransmission rate or packet error rate. An increase in the packet retransmission rate or packet error rate may be detected.

Detecting a signal degradation indication for the RF signal may include determining that a measured differential error vector magnitude (DEVM) exceeds a threshold.

Detecting a signal degradation indication for the RF signal may include determining that a measured signal spectral regrowth exceeds a threshold.

A method for wireless communication is also described. The method includes detecting a signal degradation indication for an RF signal. The method also includes causing a switch to select a combination of a first matching network and a second matching network coupled to an antenna in response to detecting the signal degradation indication.

An apparatus for wireless communication is also described. The apparatus includes means for detecting a signal degradation indication for an RF signal. The apparatus also includes means for causing a switch to select a combination of a first matching network and a second matching network coupled to an antenna in response to detecting the signal degradation indication.

A non-transitory computer readable medium storing computer executable code for wireless communication is also described. The computer readable medium includes code for causing a wireless communication device to detect a signal degradation indication for an RF signal. The computer readable medium also includes code for causing the wireless communication device to cause a switch to select a combination of a first matching network and a second matching network coupled to an antenna in response to detecting the signal degradation indication.

DETAILED DESCRIPTION

The detailed description set forth below in connection with the appended drawings is intended as a description of exemplary implementations of the disclosure and is not intended to represent the only implementations in which the disclosure may be practiced. The term "exemplary" used throughout this description means "serving as an example, instance, or illustration," and should not necessarily be construed as preferred or advantageous over other exemplary implementations. The detailed description includes specific details for the purpose of providing a thorough understanding of the exemplary implementations of the disclosure. In some instances, some devices are shown in block diagram form.

While for purposes of simplicity of explanation, the methodologies are shown and described as a series of acts, it is to be understood and appreciated that the methodologies are not limited by the order of acts, as some acts may, in accordance with one or more aspects, occur in different orders and/or concurrently with other acts from that shown and described herein. For example, those skilled in the art will understand and appreciate that a methodology could alternatively be represented as a series of interrelated states or events, such as in a state diagram. Moreover, not all illustrated acts may be required to implement a methodology in accordance with one or more aspects.

Various configurations are now described with reference to the Figures, where like reference numbers may indicate functionally similar elements. The systems and methods as generally described and illustrated in the Figures herein could be arranged and designed in a wide variety of different configurations. Thus, the following more detailed description of several configurations, as represented in the Figures, is not intended to limit scope, as claimed, but is merely representative of the systems and methods.

Figure 1:
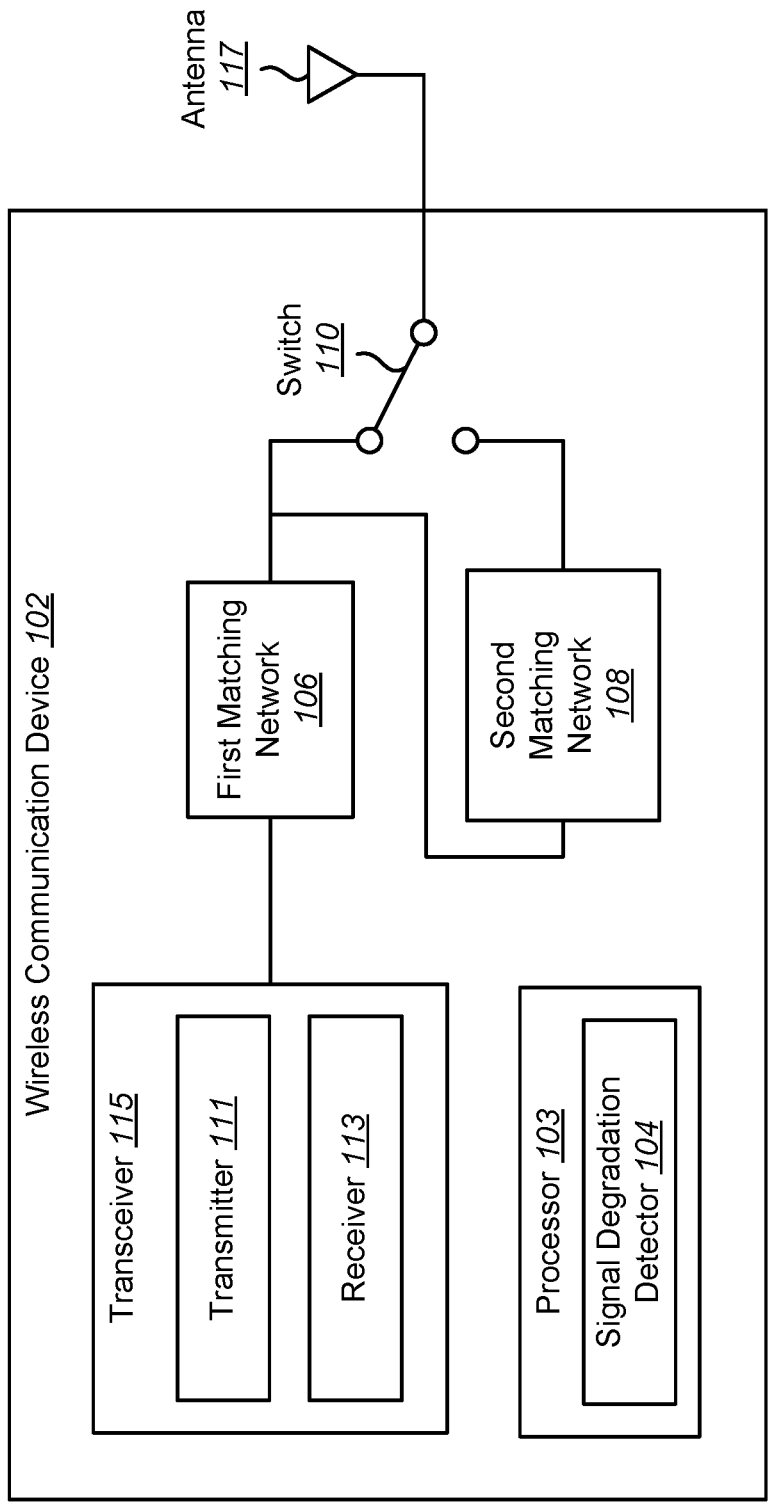
FIG. 1 is a block diagram illustrating one configuration of a wireless communication device configured to improve a radio frequency (RF) link by active antenna tuning.

FIG. 1 is a block diagram illustrating one configuration of a wireless communication device 102 configured to improve a radio frequency (RF) link by active antenna tuning. The wireless communication device 102 may also be referred to as an electronic communication device, mobile device, mobile station, subscriber station, client, client station, user equipment (UE), remote station, access terminal, mobile terminal, terminal, user terminal, subscriber unit, etc. Examples of wireless communication devices 102 include laptop or desktop computers, cellular phones, smart phones, wireless modems, e-readers, tablet devices, gaming systems, etc. Some of these devices may operate in accordance with one or more industry standards.

The wireless communication device 102 may communicate using a transceiver 115 and an antenna 117. The transceiver 115 may include a transmitter 111 and a receiver 113. The transceiver 115 may be configured to operate in accordance with one or more wireless communication protocols. For example, the transceiver 115 may be configured to communicate with a remote device using 802.11-based Wi-Fi technology. In another example, the transceiver 115 may be configured to communicate using Bluetooth technology.

The antenna 117 of a wireless communication device 102 may be configured to transmit and receive RF signals assuming that the wireless communication device 102 is surrounded by free space. However, when an obstructing object is nearby, the antenna 117 may become detuned. Benefits may be realized by active antenna tuning to improve radio frequency (RF) links in wireless communication.

In some implementations, the antenna 117 may be tuned and matched for when the wireless communication device 102 is surrounded by free space. This case may be referred to as a free space condition. A first matching network 106 may be tuned for a free space condition where the antenna 117 is not affected (or substantially unaffected) by external dielectric disturbances. For example, the components (e.g., reactive components) of the first matching network 106 may be selected to perform impedance matching for the transceiver 115 and the antenna 117 when the antenna 117 is not affected by external dielectric disturbances.

However, there may be circumstances when the antenna 117 of the wireless communication device 102 is affected by external dielectric disturbances. For example, when a wireless communication device 102 using Bluetooth is transmitting advanced audio distribution profile (A2DP) packets wirelessly to an audio headset or earbuds, the wireless communication device 102 is statistically most likely in one of the user's pockets. This is because it is less likely that the person is using the wireless communication device 102 visually to listen to music while being occupied with other tasks.

Any nearby dielectric material(s) of any kind would detune the antenna matching, resulting in less power transmitted and more power reflected as well as detuning a bandpass filter connected to the antenna 117. Dielectric materials include electrically insulating materials. The human body (e.g., hand, leg, torso, etc.) may act as a dielectric material.

In an example, perturbation of the nearfield antenna field of a wireless communication device 102 may be caused by human interactivity such as a hand or human body if the wireless communication device 102 is placed in the user's pocket. This nearfield antenna field disruption may cause detuning of the antenna 117. The detuning of the antenna 117 by the human body can be characterized in two parts: (1) detuning of the antenna impedance as seen by the preceding circuitry, and (2) the partial absorption of transmitted RF power into the body tissue. The end result is significantly reduced RF power received by the remote device (e.g., BT wireless headset). In the case of an audio transmission from the wireless communication device 102, this means degraded audio quality.

In some approaches, to counter this degraded signal quality by reduced received RF power, a higher RF power level may be used for transmission. This increase of transmitter (TX) power results directly in reduced battery life. Therefore, in these approaches, there is a tradeoff between signal quality and reduced battery life.

The systems and methods described herein provide for active antenna tuning. A low cost switchable circuit may include two (or more) different matching networks. A first matching network 106 may be used for when the antenna 117 is experiencing unhindered free space. A second matching network 108 may be used for when the antenna 117 is influenced, or detuned, by a dielectric material (e.g., the human body).

The two matching networks may be connected to a switch 110 with a common connection feeding the antenna 117. The switch 110 can select either the output of the first matching network 106 or the second matching network 108. In some implementations, the first matching network 106 may be coupled to a first terminal of the switch 110, the second wireless communication device 102 may be coupled to a second terminal of the switch 110 and the antenna 117 may be coupled to a third terminal of the switch 110.

An input of the first matching network 106 may be coupled to the transceiver 115. An output of the first matching network 106 may be coupled to the second matching network 108. When the switch 110 selects the first matching network 106, the first matching network 106 is coupled between the transceiver 115 and the antenna 117. In this case, the first matching network 106 may perform impedance matching for the transceiver 115 and the antenna 117. An example of this case is described in connection with FIG. 3 and FIG. 4.

When the switch 110 selects the first matching network 106, the second matching network 108 is a shunt with a low-resistance path. In other words, when the first matching network 106 is selected the second matching network 108 may be in parallel with the antenna 117 and it will act as a parallel component of the first matching network 106 resulting in no signal loss as the signal is not being split.

When the switch 110 selects the second matching network 108, the second matching network 108 is coupled to the first matching network 106 and to the antenna 117 serially. In other words, the first matching network 106, the second matching network 108 and the antenna 117 may be coupled in series when the switch 110 selects the second matching network 108. In this case, a combination of the first matching network 106 and the second matching network 108 may be coupled to the antenna 117 through the switch 110.

The combination of the first matching network 106 and the second matching network 108 may perform impedance matching for the transceiver 115 and the antenna 117 when the antenna 117 is affected by external dielectric disturbances. For example, the second matching network 108 may be tuned in combination with the first matching network 106 for a degraded signal condition where the antenna 117 is affected by external dielectric disturbances. The components (e.g., reactive components) of the second matching network 108 may be selected to perform impedance matching for the transceiver 115 and the antenna 117 when the antenna 117 is affected by external dielectric disturbances. An example of this configuration is described in connection with FIG. 5.

The wireless communication device 102 may cause the switch 110 to select the combination of the first matching network 106 and the second matching network 108 coupled to the antenna 117 in response to detecting a signal degradation indication. For example, the wireless communication device 102 may include a processor 103 that implements a signal degradation detector 104. The signal degradation detector 104 may monitor for a signal degradation indication associated with the RF signal. Upon detecting the signal degradation indication, the signal degradation detector 104 may cause the switch 110 to select the second matching network 108. For example, the processor 103 may send a signal to the switch 110 that causes the switch 110 to select either the first matching network 106 or the second matching network 108.

In some implementations, the signal degradation detector 104 may monitor packet retransmission rates and/or packet error rates (PER) to detect signal degradation. When a dielectric material (e.g., human body) is perturbing the antenna matching by being present in the antenna near field region, the received power at the remote device is reduced. This degraded signal may manifest itself in an increased packet retransmission rate and/or increased PER. This may be detected by the wireless communication device 102, and the RF path switch 110 may be activated. If the signal degradation detector 104 detects an increase in the packet retransmission rates and/or PER, then this indicates a degraded RF signal. The processor 103 may cause the switch 110 to select the second matching network 108. Otherwise, if there is no increase in packet retransmission rates and/or PER, or the packet retransmission rates and/or PER remain below a certain threshold, then the processor 103 may cause the switch 110 to select the first matching network 106.

In another implementation, the signal degradation detector 104 may determine that a measured differential error vector magnitude (DEVM) exceeds a threshold. For example, the receiver 113 of the wireless communication device 102 may measure a DEVM for a transmission from the wireless communication device 102. If the DEVM exceeds a threshold, then this indicates a degraded signal caused by an external dielectric disturbance. In this case, the processor 103 may cause the switch 110 to select the second matching network 108. Otherwise, if the DEVM is below the threshold, then the processor 103 may cause the switch 110 to select the first matching network 106.

In another implementation, the signal degradation detector 104 may determine that a measured signal spectral regrowth exceeds a threshold. For example, the receiver 113 of the wireless communication device 102 may measure signal spectral regrowth for a transmission from the wireless communication device 102. If the signal spectral regrowth exceeds a threshold, then this indicates a degraded signal caused by an external dielectric disturbance. In this case, the processor 103 may cause the switch 110 to select the second matching network 108. Otherwise, if the signal spectral regrowth is below the threshold, then the processor 103 may cause the switch 110 to select the first matching network 106.

It should be noted that the values of the matching network components may be fixed. Active tuning of the antenna 117 may be achieved by selecting either the first matching network 106 or the combination of the first matching network 106 and the second matching network 108.

The systems and methods described herein may improve performance of the transceiver 115. For example, insertion loss due to impedance mismatch caused by external dielectric disturbances may be reduced. In some cases, the insertion losses may be up to 4 decibels (dB). This insertion loss may be recovered according to the systems and methods described herein. Similarly, DEVM degradation due to distortion may be recovered. Additionally, receiver sensitivity may be improved when the antenna 117 is affected by external dielectric disturbances.

The described systems and methods will result in improved performance of the transmitter 111 and receiver 113 of the wireless communication device 102. For example, the first matching network 106 may be selected for a free space condition and the second matching network 108 may be selected for a degraded signal condition, which will improve signal quality and reduce power consumption. Also, because a single switch 110 is used to select the first matching network 106 or the second matching network 108, this results in a cost-effective design. Furthermore, a single switch approach may reduce the amount of area that would be used in other approaches that require multiple switches to select different matching networks.

Figure 2:
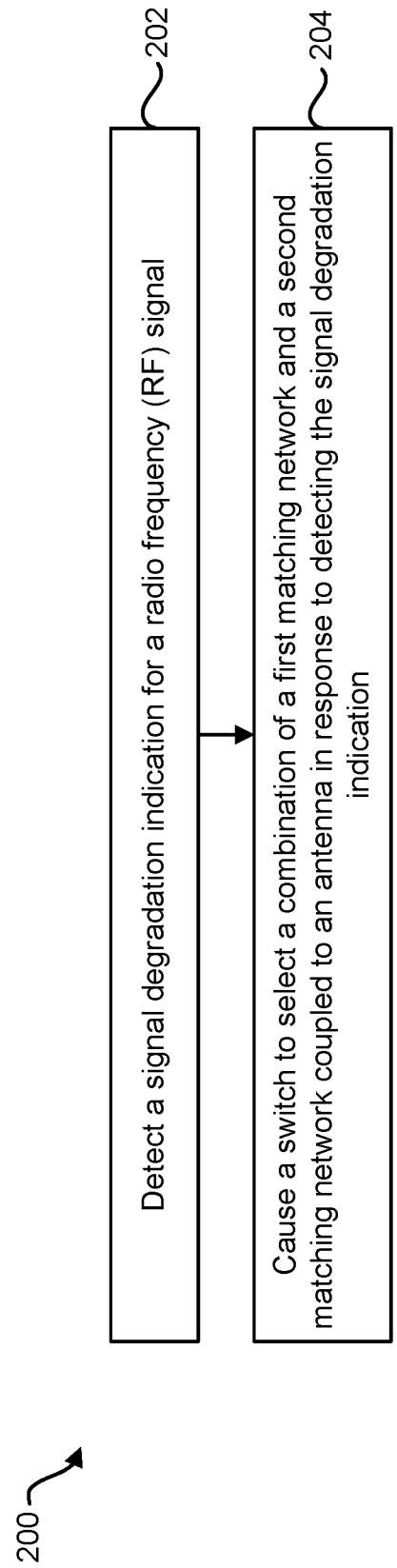
FIG. 2 is a flow diagram illustrating a method for active antenna tuning.

FIG. 2 is a flow diagram illustrating a method 200 for active antenna tuning. The method 200 may be performed by a wireless communication device 102.

The wireless communication device 102 may detect 202 a signal degradation indication for a radio frequency (RF) signal. For example, the wireless communication device 102 may monitor a packet retransmission rate or packet error rate. If the wireless communication device 102 detects an increase in the packet retransmission rate or packet error rate, this may be a signal degradation indication. In another example, the signal degradation indication may include determining that a measured differential error vector magnitude (DEVM) exceeds a threshold. In yet another example, the signal degradation indication may include determining that a measured signal spectral regrowth exceeds a threshold.

The wireless communication device 102 may cause 204 a switch 110 to select a combination of a first matching network 106 and a second matching network 108 coupled to an antenna 117 in response to detecting the signal degradation indication. The first matching network 106 may be coupled to a first terminal of the switch 110, the second wireless communication device 102 is coupled to a second terminal of the switch 110 and the antenna 117 is coupled to a third terminal of the switch 110. An input of the first matching network 106 may be coupled to a transceiver 115 and an output of the first matching network 106 may be coupled to the second matching network 108.

The second matching network 108 may be coupled to the first matching network 106 and to the antenna 117 serially when the second matching network 108 is selected by the switch 110. The second matching network 108 may be a shunt when the first matching network 106 is selected by the switch 110.

The first matching network 106 may be tuned for a free space condition where the antenna 117 is not affected by external dielectric disturbances. The second matching network 108 may be tuned in combination with the first matching network 106 for a degraded signal condition where the antenna 117 is affected by external dielectric disturbances.

Figure 3:
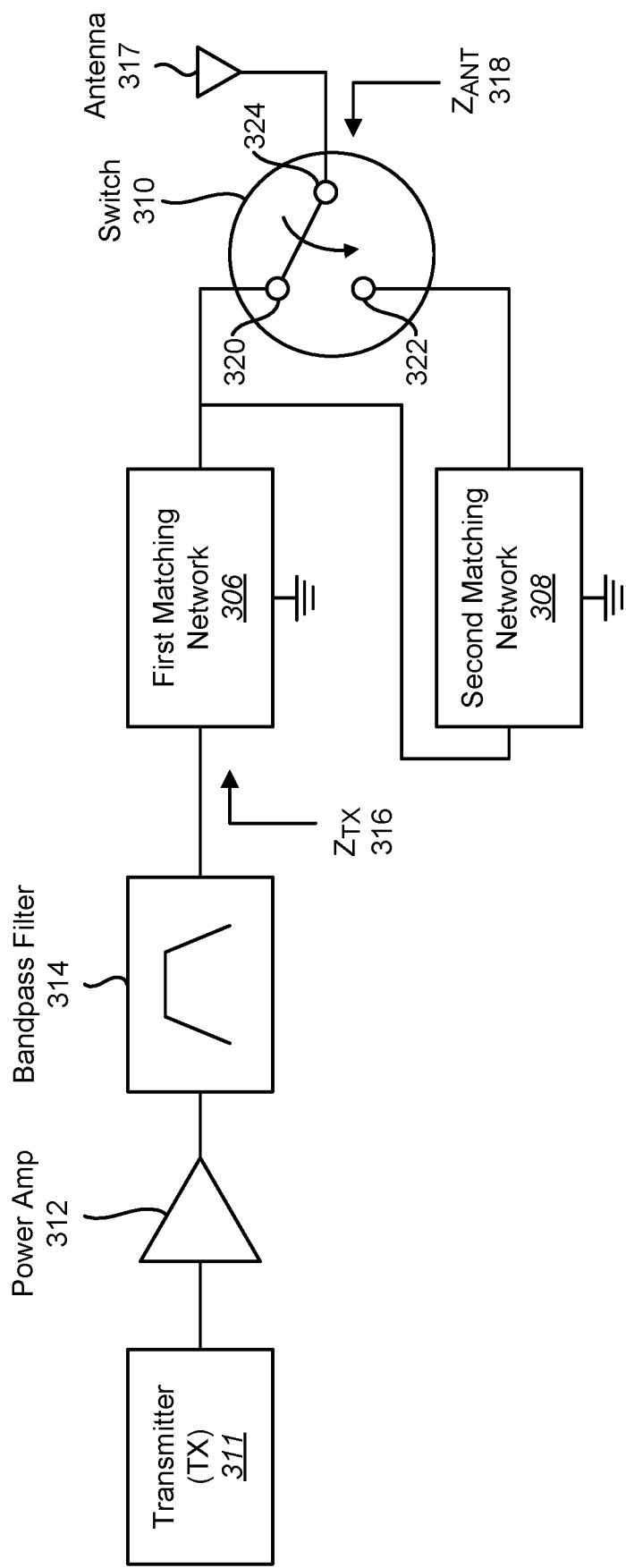
FIG. 3 is a block diagram illustrating one example of switchable antenna matching.

FIG. 3 is a block diagram illustrating one example of switchable antenna matching. This example may be implemented in accordance with the wireless communication device 102 described in connection with FIG. 1.

In this example, a transmitter 311 (e.g., Bluetooth or WiFi transmitter) may be coupled to a power amplifier (amp) 312 and a bandpass filter 314. The output of the bandpass filter 314 may be coupled to the first matching network (MN1) 306. The impedance of the first matching network 306 may be expressed as $Z_1$.

The output of the first matching network 306 may be coupled to a first terminal 320 of a switch 310. The second matching network (MN2) 308 may be coupled to the output of the first matching network 306 and a second terminal 322 of the switch 310. The third terminal 324 of the switch 310 may be coupled to the antenna 317. In some implementations, the switch 310 may be implemented as a single-pole double-throw switch.

When the first matching network 306 is selected by the switch 310, the second matching network 308 may act as a shunt. When the second matching network 308 is selected by the switch 310, the second matching network 308 is coupled to the first matching network 306 and to the antenna 317 serially.

In this example, the impedance 316 of the transmitter 311 may be expressed as $Z_{TX}$. The impedance 318 of the antenna 317 may be expressed as $Z_{ANT}$.

Figure 4:
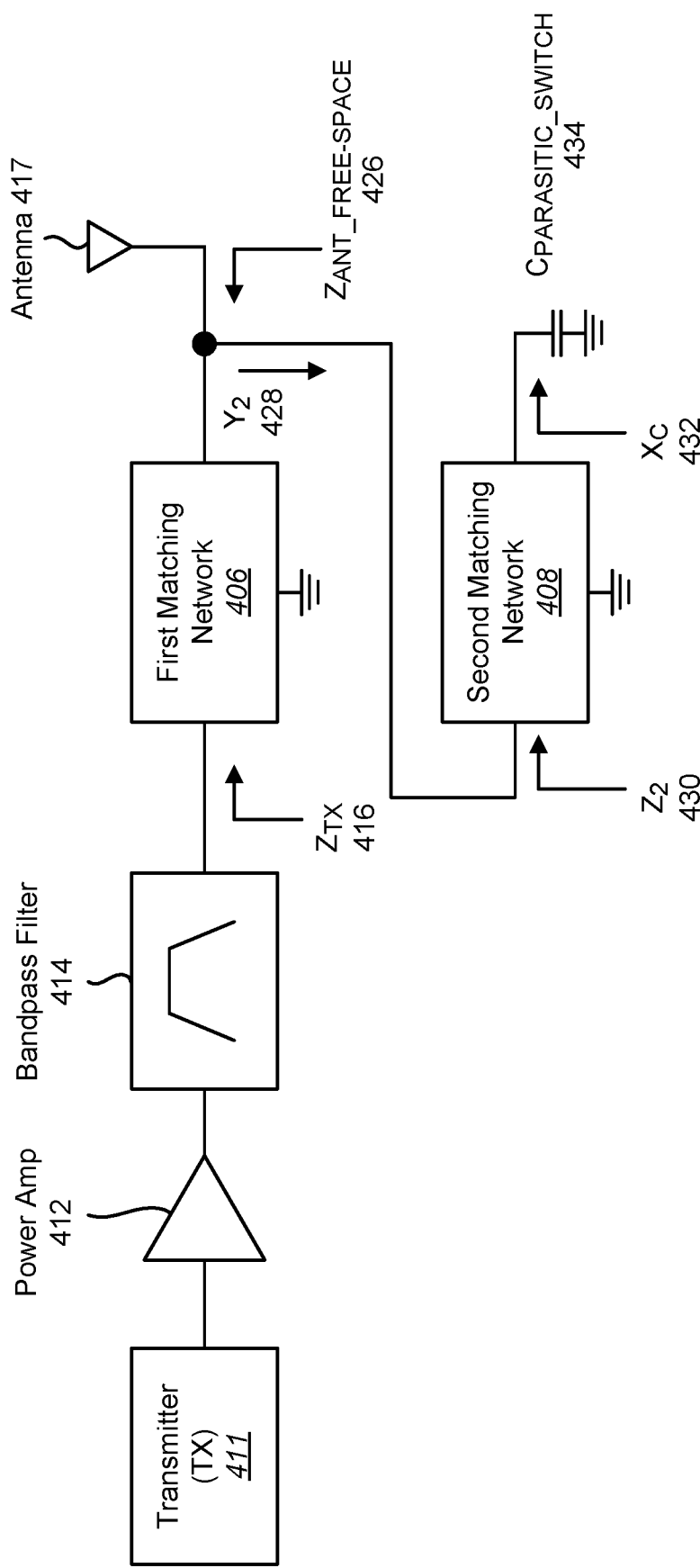
FIG. 4 is a block diagram illustrating one example of switchable antenna matching in a free space configuration.
Figure 5:
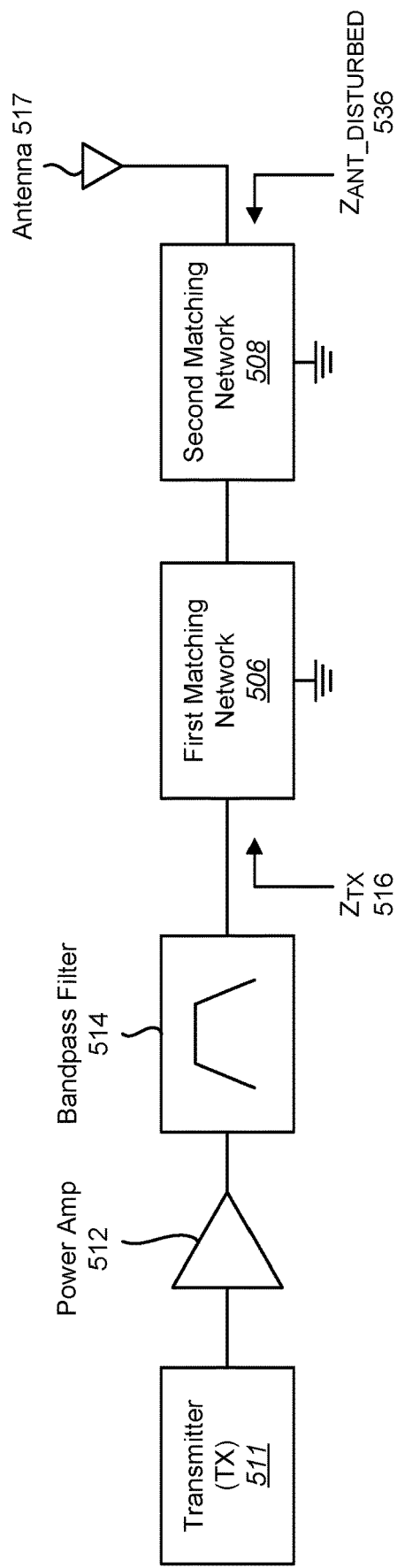
FIG. 5 is a block diagram illustrating one example of switchable antenna matching in an external dielectric disturbance configuration.

The switch 310 may select either the first matching network 306 or the second matching network 308 based on a signal degradation indication. This may be accomplished as described in connection with FIG. 1. For a free space condition (e.g., when the antenna near field region is not disturbed by the human body or hand), the first matching network 306 may be selected. The configuration for the free space condition is illustrated in FIG. 4. For a degraded signal condition, the second matching network 308 may be selected. The configuration for the degraded signal condition is illustrated in FIG. 5.

FIG. 4 is a block diagram illustrating one example of switchable antenna matching in a free space configuration. In this example, a first matching network 406 may be selected by a switch (not shown) as in FIG. 3 such that the first matching network 406 and a second matching network 408 are coupled as illustrated in FIG. 4. In this case, the first matching network 406 may be selected when there are no detected external dielectric disturbances.

A transmitter 411 (e.g., Bluetooth or WiFi transmitter), power amplifier (amp) 412 and a bandpass filter 414 may be coupled to the input of the first matching network 406. The antenna 417 may be coupled to the output of the first matching network 406. The second matching network 408 may also be coupled to the output of the first matching network 406.

This configuration may be referred to as a free space configuration. In this free space configuration, the second matching network 408 acts as a shunt. In this case, the terminal connection of the switch and the second matching network 408 may act in a parasitic manner, which may be modeled as a capacitor ($C_{PARASITIC\_SWITCH}$) 434.

In this example, the impedance of the first matching network 406 may be expressed as $Z_1$. The impedance of the transmitter 416 may be expressed as $Z_{TX}$. The impedance 426 of the antenna 417 may be expressed as $Z_{ANT\_FREE\_SPACE}$. The admittance 428 of the second matching network 408 may be expressed as $Y_2$ because the second matching network 408 is connected in parallel with the first matching network 406 with respect to the antenna 417. The impedance 430 of the second matching network 408 may be expressed as $Z_2$. The capacitive reactance 432 of the switch may be expressed as $X_C$.

The condition where the transmitter impedance ($Z_{TX}$) 416 equals the antenna impedance ($Z_{ANT\_FREE\_SPACE}$) 426 may be solved according to Equations 1-5.

$$Z_1 = \begin{bmatrix} 1 & Z_1 \\ 0 & 1 \end{bmatrix} \tag{1}$$

$$Z_2 = \begin{bmatrix} 1 & Z_2 \\ 0 & 1 \end{bmatrix}\begin{bmatrix} 1 & X_C \\ 0 & 1 \end{bmatrix} = \begin{bmatrix} 1 & Z_2 + X_C \\ 0 & 1 \end{bmatrix} \tag{2}$$

$$Y_2 = \begin{bmatrix} 1 & 0 \\ \dfrac{1}{Z_2 + X_C} & 1 \end{bmatrix} \tag{3}$$

$$Z_{ANT\_FREE\_SPACE} = \begin{bmatrix} 1 & Z_{ANT\_FREE\_SPACE} \\ 0 & 1 \end{bmatrix} \tag{4}$$

$$Z_{TX} = \begin{bmatrix} 1 & Z_1 \\ 0 & 1 \end{bmatrix}\begin{bmatrix} 1 & 0 \\ \dfrac{1}{Z_2 + X_C} & 1 \end{bmatrix}\begin{bmatrix} 1 & Z_{ANT\_FREE\_SPACE} \\ 0 & 1 \end{bmatrix} \tag{5}$$

FIG. 5 is a block diagram illustrating one example of switchable antenna matching in an external dielectric disturbance configuration. In this example, a second matching network 508 may be selected by a switch (not shown) as in FIG. 3 such that a first matching network 506 and the second matching network 508 are coupled as illustrated in FIG. 5. In this case, the second matching network 508 may be selected when there are detected external dielectric disturbances.

A transmitter 511 (e.g., Bluetooth or WiFi transmitter), power amplifier (amp) 512 and a bandpass filter 514 may be coupled to the input of the first matching network 506. The input of the second matching network 508 may be coupled to the output of the first matching network 506. The antenna 517 may be coupled to the output of the second matching network 508. In this external dielectric disturbance configuration, the second matching network 508 is coupled to the first matching network 506 and to the antenna 517 serially.

In this example, the impedance of the first matching network 506 may be expressed as $Z_1$. The impedance 516 of the transmitter 511 may be expressed as $Z_{TX}$. The impedance 536 of the antenna 517 may be expressed as $Z_{ANT\_DISTURBED}$. The impedance of the second matching network may be expressed as $Z_2$.

The condition where the transmitter impedance ($Z_{TX}$) 516 equals the antenna impedance ($Z_{ANT\_DISTURBED}$) 536 may be solved according to Equations 6-9.

$$Z_1 = \begin{bmatrix} 1 & Z_1 \\ 0 & 1 \end{bmatrix} \quad (6)$$

$$Z_2 = \begin{bmatrix} 1 & Z_2 \\ 0 & 1 \end{bmatrix} \quad (7)$$

$$Z_{ANT\_DISTURBED} = \begin{bmatrix} 1 & Z_{ANT\_DISTURBED} \\ 0 & 1 \end{bmatrix} \quad (8)$$

$$Z_{TX} = \begin{bmatrix} 1 & Z_1 \\ 0 & 1 \end{bmatrix} \begin{bmatrix} 1 & Z_2 \\ 0 & 1 \end{bmatrix} \begin{bmatrix} 1 & Z_{ANT\_DISTURBED} \\ 0 & 1 \end{bmatrix} \quad (9)$$

Figure 6:
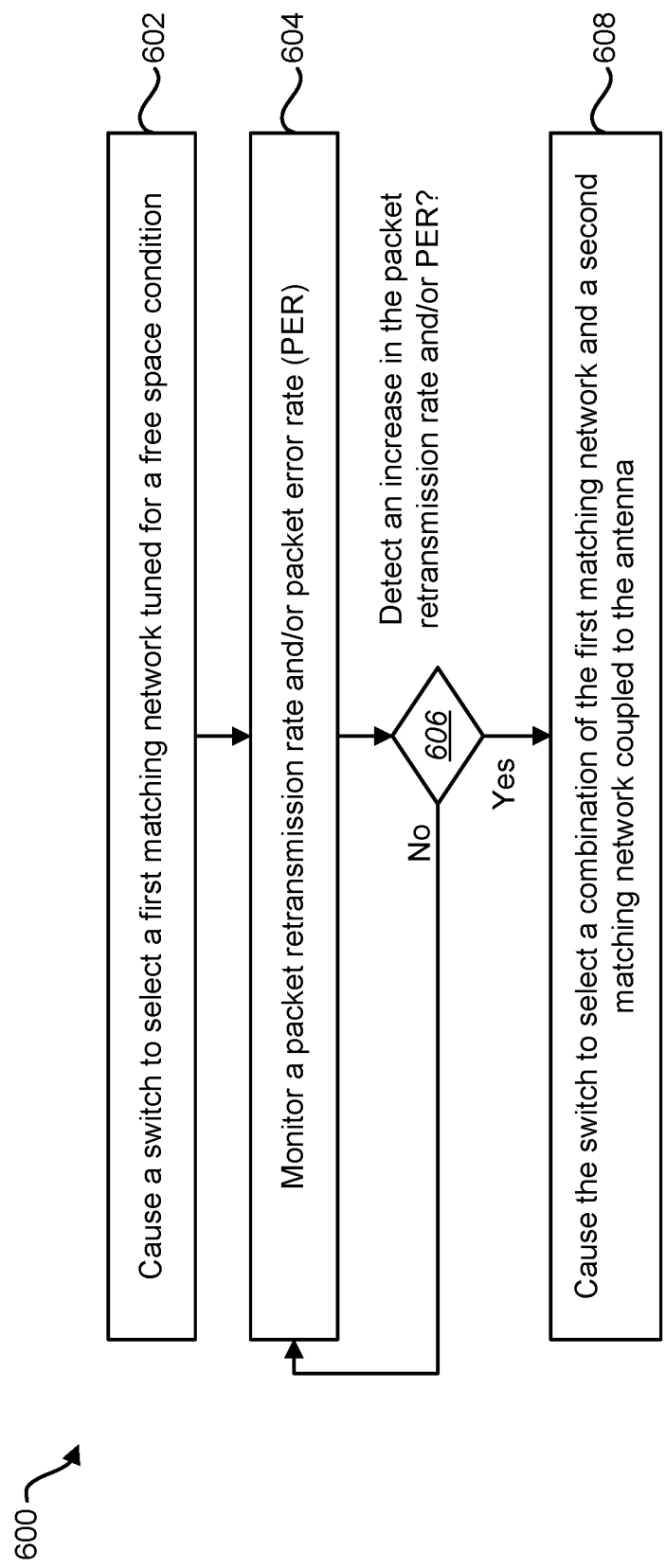
FIG. 6 is a flow diagram illustrating a method for active antenna tuning.

FIG. 6 is a flow diagram illustrating a method 600 for active antenna tuning. The method 600 may be performed by a wireless communication device 102.

The wireless communication device 102 may cause 602 a switch 110 to select a first matching network 106 tuned for a free space condition. The first matching network 106 may be tuned for a free space condition where an antenna 117 is not affected by external dielectric disturbances. For example, the components (e.g., reactive components) of the first matching network 106 may be selected to perform impedance matching for the transceiver 115 and the antenna 117 when the antenna 117 is not affected or substantially unaffected by external dielectric disturbances.

The wireless communication device 102 may monitor 604 a packet retransmission rate and/or packet error rate (PER). For example, when a dielectric material (e.g., human body) is perturbing the antenna matching by being present in the antenna near field region, the received power at the remote device is reduced. This degraded signal may manifest itself in an increased packet retransmission rate and/or increased PER at the wireless communication device 102. If the wireless communication device 102 does not detect 606 an increase in the packet retransmission rate or PER, the wireless communication device 102 may continue to monitor 604 the packet retransmission rate and/or PER.

If the wireless communication device 102 detects 606 an increase in the packet retransmission rate or PER, the wireless communication device 102 may cause 608 the switch 110 to select a combination of the first matching network 106 and a second matching network 108 coupled to the antenna 117. The second matching network 108 may be tuned in combination with the first matching network 106 for a degraded signal condition where the antenna 117 is affected by external dielectric disturbances.

Figure 7:
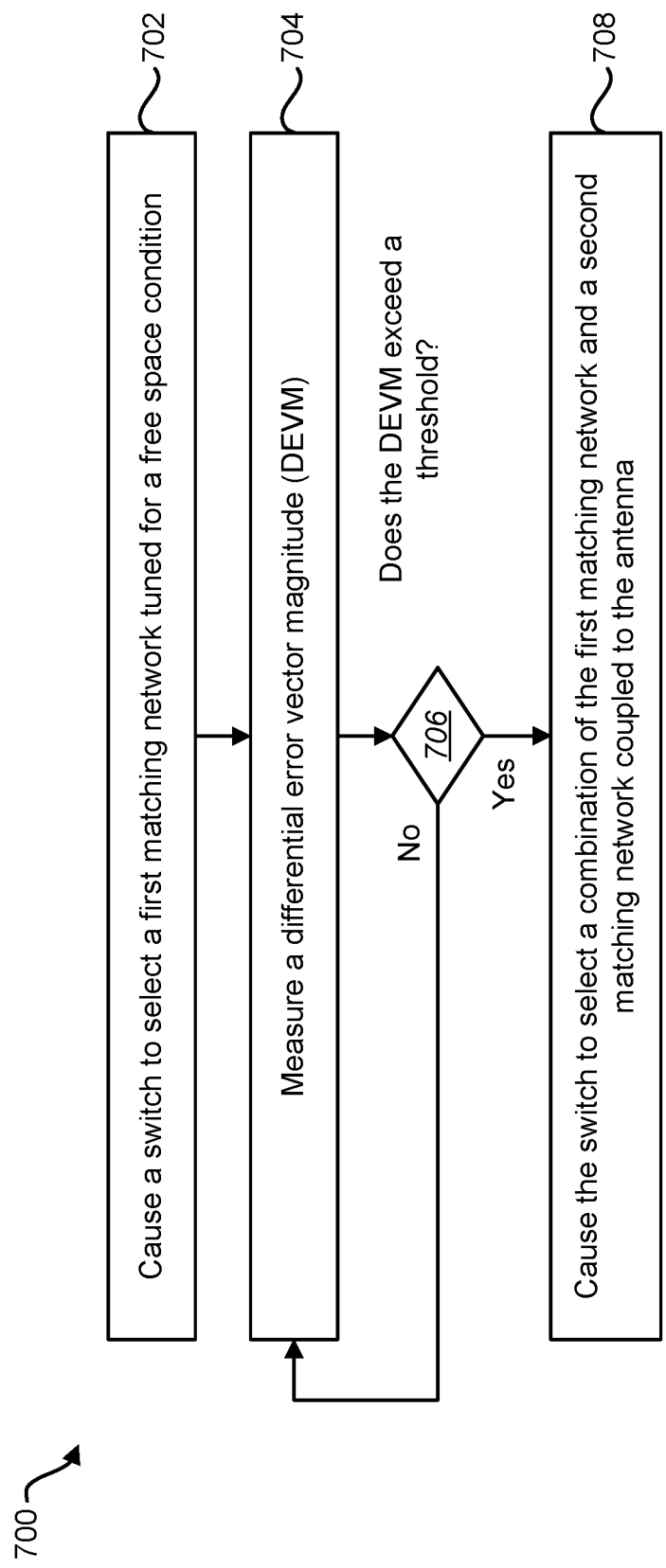
FIG. 7 is a flow diagram illustrating another method for active antenna tuning.

FIG. 7 is a flow diagram illustrating another method 700 for active antenna tuning. The method 700 may be performed by a wireless communication device 102.

The wireless communication device 102 may cause 702 a switch 110 to select a first matching network 106 tuned for a free space condition. The first matching network 106 may be tuned for a free space condition where an antenna 117 is not affected by external dielectric disturbances.

The wireless communication device 102 may measure 704 a differential error vector magnitude (DEVM). In some implementations, DEVM may be the root mean square (RMS) of error vectors, computed and expressed as a percentage of the average power of a stimulus signal. The DEVM may be the length of a vector that connects a stimulus time-point to a corresponding response time-point. The DEVM (also referred to as relative constellation error or RCE) is a measure that may be used to quantify the performance of a digital radio transmitter or receiver. A signal sent by an ideal transmitter or received by an ideal receiver would have all constellation points precisely at ideal locations. However, various imperfections in the implementation (e.g., carrier leakage, low image rejection ratio, phase noise, etc.) may cause the actual constellation points to deviate from the ideal locations. DEVM may be a measure of how far the points are from the ideal locations. Noise, distortion, and phase noise due to a dielectric material (e.g., human body) may degrade DEVM. Therefore, DEVM may provide a measure of the quality of the radio receiver or transmitter for use in digital communications. If the wireless communication device 102 determines 706 that the DEVM does not exceed a threshold, then the wireless communication device 102 may continue to measure 704 the DEVM.

If the wireless communication device 102 determines 706 that the DEVM exceeds a threshold, then the wireless communication device 102 may cause 708 the switch 110 to select a combination of the first matching network 106 and a second matching network 108 coupled to the antenna 117. The second matching network 108 may be tuned in combination with the first matching network 106 for a degraded signal condition where the antenna 117 is affected by external dielectric disturbances.

Figure 8:
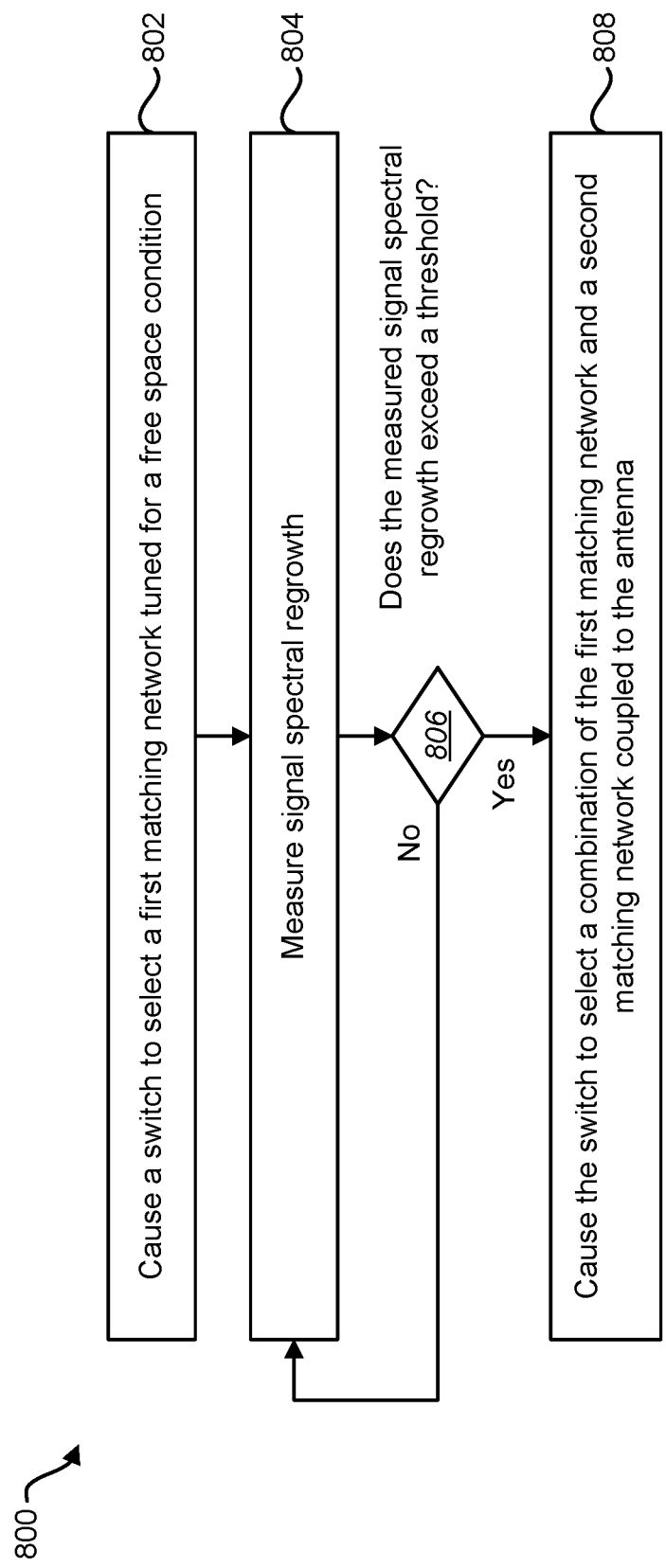
FIG. 8 is a flow diagram illustrating another method for active antenna tuning.

FIG. 8 is a flow diagram illustrating another method 800 for active antenna tuning. The method 800 may be performed by a wireless communication device 102.

The wireless communication device 102 may cause 802 a switch 110 to select a first matching network 106 tuned for a free space condition. The first matching network 106 may be tuned for a free space condition where an antenna 117 is not affected by external dielectric disturbances.

The wireless communication device 102 may measure 804 signal spectral regrowth. Intermodulation products, or spurs, may develop within analog and digital transmitters in combined systems using high-level injection. In some cases, spurs may result in sub-optimal signal quality or may even cause signals to interfere with another signal. The term spectral regrowth refers to intermodulation products (e.g., spurs) generated when a digital transmitter is added to an analog transmission system. If the wireless communication device 102 determines 806 that the measured signal spectral regrowth does not exceed a threshold, then the wireless communication device 102 may continue to measure 804 the signal spectral regrowth.

If the wireless communication device 102 determines 806 that the measured signal spectral regrowth exceeds a threshold, then the wireless communication device 102 may cause 808 the switch 110 to select a combination of the first matching network 106 and a second matching network 108 coupled to the antenna 117. The second matching network 108 may be tuned in combination with the first matching network 106 for a degraded signal condition where the antenna 117 is affected by external dielectric disturbances.

Figure 9:
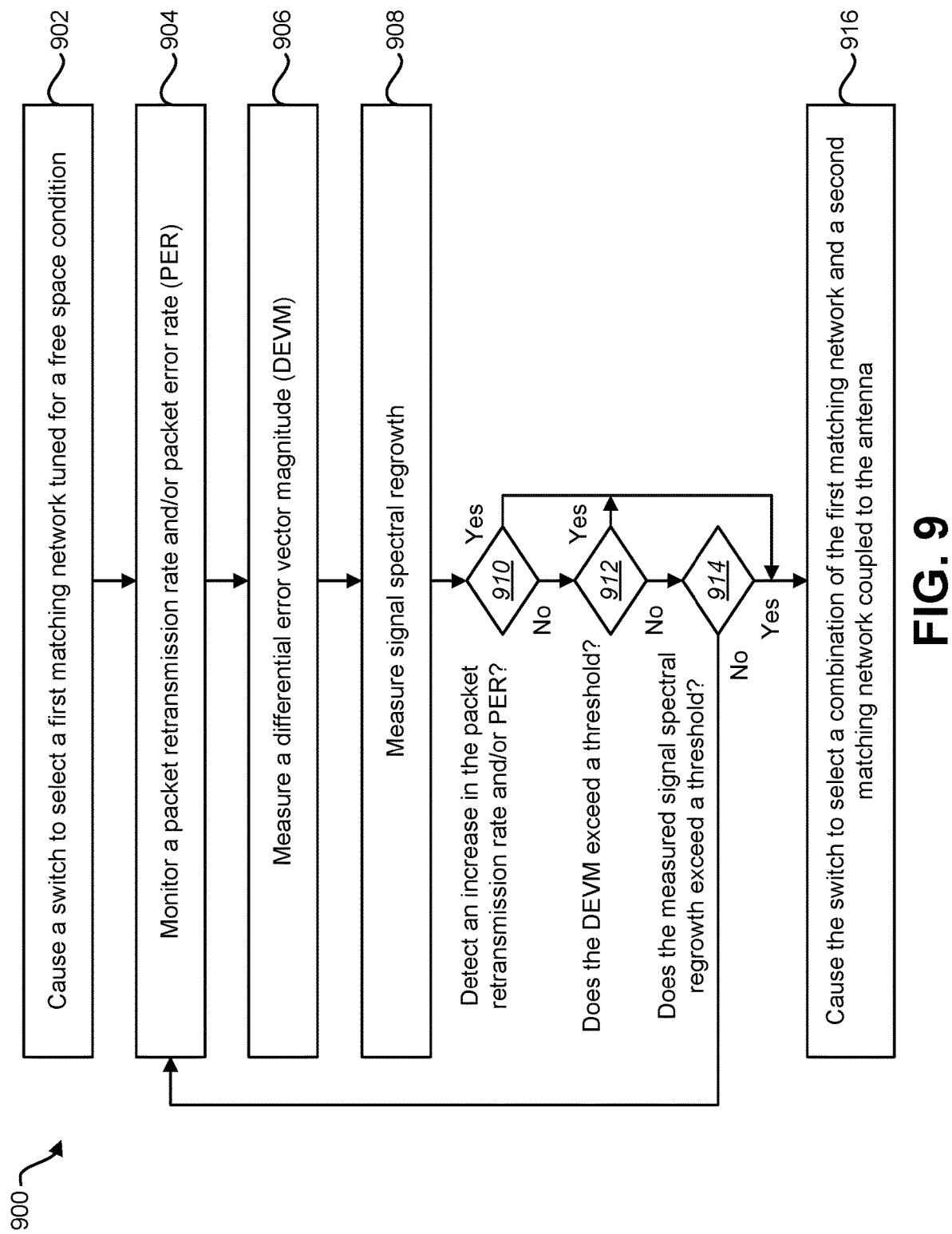
FIG. 9 is a flow diagram illustrating yet another method for active antenna tuning.

FIG. 9 is a flow diagram illustrating yet another method 900 for active antenna tuning. The method 900 may be performed by a wireless communication device 102.

The wireless communication device 102 may cause 902 a switch 110 to select a first matching network 106 tuned for a free space condition. The first matching network 106 may be tuned for a free space condition where an antenna 117 is not affected by external dielectric disturbances.

The wireless communication device 102 may monitor 904 a packet retransmission rate and/or packet error rate (PER). This may be accomplished as described in connection with FIG. 6.

The wireless communication device 102 may measure 906 a differential error vector magnitude (DEVM). This may be accomplished as described in connection with FIG. 7.

The wireless communication device 102 may measure 908 signal spectral regrowth. This may be accomplished as described in connection with FIG. 8.

If the wireless communication device 102 detects 910 an increase in the packet retransmission rate or PER, the wireless communication device 102 may cause 916 the switch 110 to select a combination of the first matching network 106 and a second matching network 108 coupled to the antenna 117. The second matching network 108 may be tuned in combination with the first matching network 106 for a degraded signal condition where the antenna 117 is affected by external dielectric disturbances.

If the wireless communication device 102 determines 912 that the DEVM exceeds a threshold, then the wireless communication device 102 may cause 916 the switch 110 to select the combination of the first matching network 106 and the second matching network 108 coupled to the antenna 117.

If the wireless communication device 102 determines 914 that the measured signal spectral regrowth exceeds a threshold, then the wireless communication device 102 may cause 916 the switch 110 to select the combination of the first matching network 106 and the second matching network 108 coupled to the antenna 117. Otherwise, if the wireless communication device 102 determines 914 that the measured signal spectral regrowth does not exceed a threshold, then the wireless communication device 102 may continue to monitor 904 the packet retransmission rate, the PER, the DEVM and/or the signal spectral regrowth.

Figure 10:
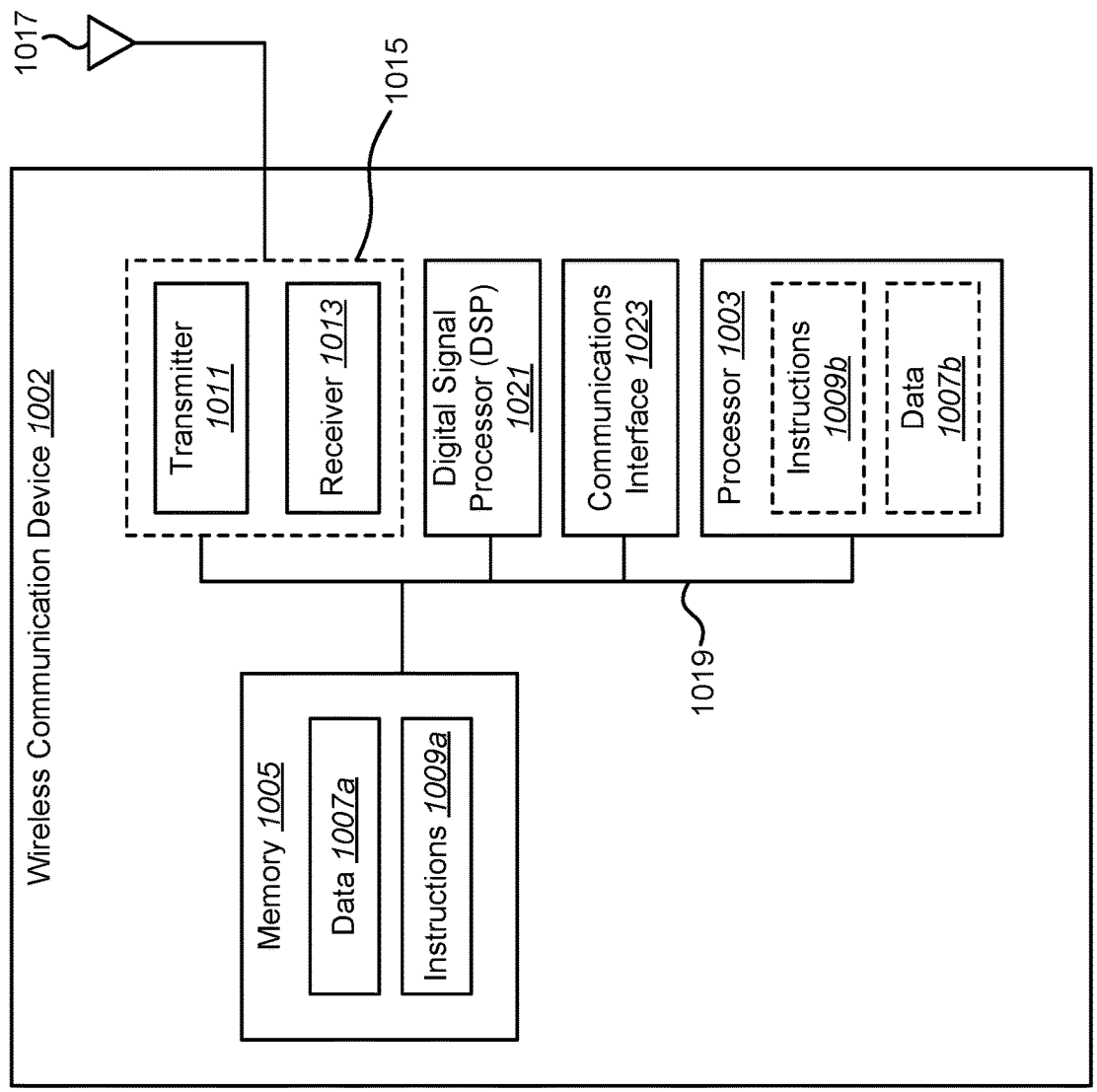
FIG. 10 illustrates certain components that may be included within a wireless communication device.

FIG. 10 illustrates certain components that may be included within a wireless communication device 1002. The wireless communication device 1002 may be a wireless device, an access terminal, a mobile station, a user equipment (UE), a laptop computer, a desktop computer, etc. For example, the wireless communication device 1002 of FIG. 10 may be implemented in accordance with the wireless communication device 102 of FIG. 1.

The wireless communication device 1002 includes a processor 1003. The processor 1003 may be a general purpose single- or multi-chip microprocessor (e.g., an Advanced RISC (Reduced Instruction Set Computer) Machine (ARM)), a special purpose microprocessor (e.g., a digital signal processor (DSP)), a microcontroller, a programmable gate array, etc. The processor 1003 may be referred to as a central processing unit (CPU). Although just a single processor 1003 is shown in the wireless communication device 1002 of FIG. 10, in an alternative configuration, a combination of processors (e.g., an ARM and DSP) could be used.

The wireless communication device 1002 also includes memory 1005 in electronic communication with the processor 1003 (i.e., the processor can read information from and/or write information to the memory). The memory 1005 may be any electronic component capable of storing electronic information. The memory 1005 may be configured as random access memory (RAM), read-only memory (ROM), magnetic disk storage media, optical storage media, flash memory devices in RAM, on-board memory included with the processor, EPROM memory, EEPROM memory, registers and so forth, including combinations thereof.

Data 1007a and instructions 1009a may be stored in the memory 1005. The instructions 1009a may include one or more programs, routines, sub-routines, functions, procedures, code, etc. The instructions 1009a may include a single computer-readable statement or many computer-readable statements. The instructions 1009a may be executable by the processor 1003 to implement the methods disclosed herein. Executing the instructions 1009a may involve the use of the data 1007a that is stored in the memory 1005. When the processor 1003 executes the instructions 1009, various portions of the instructions 1009b may be loaded onto the processor 1003, and various pieces of data 1007b may be loaded onto the processor 1003.

The wireless communication device 1002 may also include a transmitter 1011 and a receiver 1013 to allow transmission and reception of signals to and from the wireless communication device 1002 via an antenna 1017. The transmitter 1011 and receiver 1013 may be collectively referred to as a transceiver 1015. The wireless communication device 1002 may also include (not shown) multiple transmitters, multiple antennas, multiple receivers and/or multiple transceivers.

The wireless communication device 1002 may include a digital signal processor (DSP) 1021. The wireless communication device 1002 may also include a communications interface 1023. The communications interface 1023 may allow a user to interact with the wireless communication device 1002.

The various components of the wireless communication device 1002 may be coupled together by one or more buses, which may include a power bus, a control signal bus, a status signal bus, a data bus, etc. For the sake of clarity, the various buses are illustrated in FIG. 10 as a bus system 1019.

In the above description, reference numbers have sometimes been used in connection with various terms. Where a term is used in connection with a reference number, this may be meant to refer to a specific element that is shown in one or more of the Figures. Where a term is used without a reference number, this may be meant to refer generally to the term without limitation to any particular Figure.

The term "determining" encompasses a wide variety of actions and, therefore, "determining" can include calculating, computing, processing, deriving, investigating, looking up (e.g., looking up in a table, a database or another data structure), ascertaining and the like. Also, "determining" can include receiving (e.g., receiving information), accessing (e.g., accessing data in a memory) and the like. Also, "determining" can include resolving, selecting, choosing, establishing and the like.

The phrase "based on" does not mean "based only on," unless expressly specified otherwise. In other words, the phrase "based on" describes both "based only on" and "based at least on."

The term "processor" should be interpreted broadly to encompass a general purpose processor, a central processing unit (CPU), a microprocessor, a digital signal processor (DSP), a controller, a microcontroller, a state machine, and so forth. Under some circumstances, a "processor" may refer to an application specific integrated circuit (ASIC), a programmable logic device (PLD), a field programmable gate array (FPGA), etc. The term "processor" may refer to a combination of processing devices, e.g., a combination of a digital signal processor (DSP) and a microprocessor, a plurality of microprocessors, one or more microprocessors in conjunction with a digital signal processor (DSP) core, or any other such configuration.

The term "memory" should be interpreted broadly to encompass any electronic component capable of storing electronic information. The term memory may refer to various types of processor-readable media such as random access memory (RAM), read-only memory (ROM), non-volatile random access memory (NVRAM), programmable read-only memory (PROM), erasable programmable read-only memory (EPROM), electrically erasable PROM (EEPROM), flash memory, magnetic or optical data storage, registers, etc. Memory is said to be in electronic communication with a processor if the processor can read information from and/or write information to the memory. Memory that is integral to a processor is in electronic communication with the processor.

The terms "instructions" and "code" should be interpreted broadly to include any type of computer-readable statement(s). For example, the terms "instructions" and "code" may refer to one or more programs, routines, subroutines, functions, procedures, etc. "Instructions" and "code" may comprise a single computer-readable statement or many computer-readable statements.

As used herein, the term "and/or" should be interpreted to mean one or more items. For example, the phrase "A, B and/or C" should be interpreted to mean any of: only A, only B, only C, A and B (but not C), B and C (but not A), A and C (but not B), or all of A, B, and C. As used herein, the phrase "at least one of" should be interpreted to mean one or more items. For example, the phrase "at least one of A, B and C" or the phrase "at least one of A, B or C" should be interpreted to mean any of: only A, only B, only C, A and B (but not C), B and C (but not A), A and C (but not B), or all of A, B, and C. As used herein, the phrase "one or more of" should be interpreted to mean one or more items. For example, the phrase "one or more of A, B and C" or the phrase "one or more of A, B or C" should be interpreted to mean any of: only A, only B, only C, A and B (but not C), B and C (but not A), A and C (but not B), or all of A, B, and C.

The functions described herein may be implemented in software or firmware being executed by hardware. The functions may be stored as one or more instructions on a computer-readable medium. The terms "computer-readable medium" or "computer-program product" refers to any tangible storage medium that can be accessed by a computer or a processor. By way of example, and not limitation, a computer-readable medium may include RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Disk and disc, as used herein, includes compact disc (CD), laser disc, optical disc, digital versatile disc (DVD), floppy disk and Blu-ray® disc where disks usually reproduce data magnetically, while discs reproduce data optically with lasers. It should be noted that a computer-readable medium may be tangible and non-transitory. The term "computer-program product" refers to a computing device or processor in combination with code or instructions (e.g., a "program") that may be executed, processed or computed by the computing device or processor. As used herein, the term "code" may refer to software, instructions, code or data that is/are executable by a computing device or processor.

Software or instructions may also be transmitted over a transmission medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of transmission medium.

The methods disclosed herein comprise one or more steps or actions for achieving the described method. The method steps and/or actions may be interchanged with one another without departing from the scope of the claims. In other words, unless a specific order of steps or actions is required for proper operation of the method that is being described, the order and/or use of specific steps and/or actions may be modified without departing from the scope of the claims.

Further, it should be appreciated that modules and/or other appropriate means for performing the methods and techniques described herein can be downloaded and/or otherwise obtained by a device. For example, a device may be coupled to a server to facilitate the transfer of means for performing the methods described herein. Alternatively, various methods described herein can be provided via a storage means (e.g., random access memory (RAM), read only memory (ROM), a physical storage medium such as a compact disc (CD) or floppy disk, etc.), such that a device may obtain the various methods upon coupling or providing the storage means to the device. Moreover, any other suitable technique for providing the methods and techniques described herein to a device can be utilized.

It is to be understood that the claims are not limited to the precise configuration and components illustrated above. Various modifications, changes and variations may be made in the arrangement, operation and details of the systems, methods, and apparatus described herein without departing from the scope of the claims.

What is claimed is:

1. A wireless communication device, comprising:
   a processor;
   a memory in communication with the processor; and
   instructions stored in the memory, the instructions executable by the processor to:
   detect a signal degradation indication for a radio frequency (RF) signal; and
   cause a switch to select a combination of a first matching network and a second matching network coupled to an antenna in response to detecting the signal degradation indication, wherein a first terminal of the switch is coupled to the first matching network and to the second matching network at a node between the first matching network and the second matching network, the second matching network is coupled to a second terminal of the switch, and the antenna is coupled to a third terminal of the switch.

2. The wireless communication device of claim 1, wherein the second matching network is coupled to the first matching network and to the antenna serially when the second matching network is selected by the switch.

3. The wireless communication device of claim 1, wherein the second matching network is a shunt when the first matching network is selected by the switch.

4. The wireless communication device of claim 1, wherein the second terminal and the second matching network act in a parasitic manner when the first matching network is selected by the switch.

5. The wireless communication device of claim 1, wherein an input of the first matching network is coupled to a transceiver and an output of the first matching network is coupled to the second matching network.

6. The wireless communication device of claim 1, wherein the first matching network is tuned for a free space condition where the antenna is not affected by external dielectric disturbances.

7. The wireless communication device of claim 1, wherein the second matching network is tuned in combination with the first matching network for a degraded signal condition where the antenna is affected by external dielectric disturbances.

8. The wireless communication device of claim 1, wherein detecting a signal degradation indication for the RF signal comprises:
monitoring a packet retransmission rate or packet error rate; and
detecting an increase in the packet retransmission rate or packet error rate.

9. The wireless communication device of claim 1, wherein detecting a signal degradation indication for the RF signal comprises:
determining that a measured differential error vector magnitude (DEVM) exceeds a threshold.

10. The wireless communication device of claim 1, wherein detecting a signal degradation indication for the RF signal comprises:
determining that a measured signal spectral regrowth exceeds a threshold.

11. A method for wireless communication, comprising:
detecting a signal degradation indication for a radio frequency (RF) signal; and
causing a switch to select a combination of a first matching network and a second matching network coupled to an antenna in response to detecting the signal degradation indication, wherein a first terminal of the switch is coupled to the first matching network and to the second matching network at a node between the first matching network and the second matching network, the second matching network is coupled to a second terminal of the switch, and the antenna is coupled to a third terminal of the switch.

12. The method of claim 11, wherein the second matching network is coupled to the first matching network and to the antenna serially when the second matching network is selected by the switch.

13. The method of claim 11, wherein the second matching network is a shunt when the first matching network is selected by the switch.

14. The method of claim 11, wherein the second terminal and the second matching network act in a parasitic manner when the first matching network is selected by the switch.

15. The method of claim 11, wherein an input of the first matching network is coupled to a transceiver and an output of the first matching network is coupled to the second matching network.

16. The method of claim 11, wherein the second matching network is tuned in combination with the first matching network for a degraded signal condition where the antenna is affected by external dielectric disturbances.

17. The method of claim 11, wherein detecting a signal degradation indication for the RF signal comprises:
monitoring a packet retransmission rate or packet error rate; and
detecting an increase in the packet retransmission rate or packet error rate.

18. An apparatus for wireless communication, comprising:
means for detecting a signal degradation indication for a radio frequency (RF) signal; and
means for causing a switch to select a combination of a first matching network and a second matching network coupled to an antenna in response to detecting the signal degradation indication, wherein a first terminal of the switch is coupled to the first matching network and to the second matching network at a node between the first matching network and the second matching network, the second matching network is coupled to a second terminal of the switch, and the antenna is coupled to a third terminal of the switch.

19. The apparatus of claim 18, wherein the second matching network is coupled to the first matching network and to the antenna serially when the second matching network is selected by the switch.

20. The apparatus of claim 18, wherein the second matching network is a shunt when the first matching network is selected by the switch.

21. The apparatus of claim 18, wherein the second terminal and the second matching network act in a parasitic manner when the first matching network is selected by the switch.

22. The apparatus of claim 18, wherein an input of the first matching network is coupled to a transceiver and an output of the first matching network is coupled to the second matching network.

23. The apparatus of claim 18, wherein the second matching network is tuned in combination with the first matching network for a degraded signal condition where the antenna is affected by external dielectric disturbances.

24. The apparatus of claim 18, wherein the means for detecting a signal degradation indication for the RF signal comprise:
means for monitoring a packet retransmission rate or packet error rate; and
means for detecting an increase in the packet retransmission rate or packet error rate.

25. A non-transitory computer readable medium storing computer executable code for wireless communication, comprising:
code for causing a wireless communication device to detect a signal degradation indication for a radio frequency (RF) signal; and
code for causing the wireless communication device to cause a switch to select a combination of a first matching network and a second matching network coupled to an antenna in response to detecting the signal degradation indication, wherein a first terminal of the switch is coupled to the first matching network and to the second matching network at a node between the first matching network and the second matching network, the second matching network is coupled to a second terminal of the switch, and the antenna is coupled to a third terminal of the switch.

26. The computer readable medium of claim 25, wherein the second matching network is coupled to the first matching network and to the antenna serially when the second matching network is selected by the switch.

27. The computer readable medium of claim 25, wherein the second matching network is a shunt when the first matching network is selected by the switch.

28. The computer readable medium of claim 25, wherein the second terminal and the second matching network act in a parasitic manner when the first matching network is selected by the switch.

29. The computer readable medium of claim 25, wherein an input of the first matching network is coupled to a transceiver and an output of the first matching network is coupled to the second matching network.

30. The computer readable medium of claim 25, wherein the code for causing the wireless communication device to detect a signal degradation indication for the RF signal comprises:
  code for causing the wireless communication device to monitor a packet retransmission rate or packet error rate; and
  code for causing the wireless communication device to detect an increase in the packet retransmission rate or packet error rate.

\* \* \* \* \*